United States Patent [19]

Thorpe

[11] 3,733,559

[45] May 15, 1973

[54] DIFFERENTIAL AMPLIFIER

[75] Inventor: Laurence Joseph Thorpe, Marlton, N.J.

[73] Assignee: RCA Corporation, New York, N.Y.

[22] Filed: June 29, 1970

[21] Appl. No.: 50,534

[52] U.S. Cl. ....................330/30 D, 330/28, 330/69

[51] Int. Cl. ....................H03f 3/68

[58] Field of Search ....................330/28, 30, 30 D, 330/69

[56] References Cited

UNITED STATES PATENTS

| | | | |
|---|---|---|---|
| 3,599,015 | 8/1971 | Ulrick | 330/30 D X |
| 3,473,137 | 9/1969 | Stern | 330/30 |
| 3,304,512 | 2/1967 | McMillan | 330/69 X |

*Primary Examiner*—Roy Lake
*Assistant Examiner*—Lawrence J. Dahl
*Attorney*—Eugene M. Whitacre

[57] ABSTRACT

The output circuit electrodes of first and second transistor input stages are coupled by unidirectional current conducting negative feedback means to the input circuit electrodes of the second and first stages respectively, the electrodes of each stage common to the input and output circuits thereof being coupled to one another by bidirectional current conducting means.

8 Claims, 3 Drawing Figures

INVENTOR.
LAURENCE J. THORPE
BY
Eugene M. Whitacre
Attorney

INVENTOR.
LAURENCE J. THORPE
BY Eugene M. Whitacre
Attorney

DIFFERENTIAL AMPLIFIER

BACKGROUND OF THE INVENTION

There is a need, particularly in some television video signal processing circuits, for a high performance amplifier with differential input and output circuits and with overall negative feedback. Such an amplifier must also have good common mode rejection of the signals applied to both of its branches. In order to achieve the high quality of differential video signal amplification required for use in clamping and remote gain control amplifiers, for example, it is necessary that such an amplifier have a considerable amount of negative feedback which remains operative throughout a substantial range of signal frequencies including the 3.58 MHz color subcarrier frequency region. This requirement is necessary in order to insure a minimum of differential phase and gain distortions of the video signal.

The overall negative feedback arrangements of the prior art, however, are unsatisfactory because the common mode signal rejection action of such an amplifier is materially impaired. Common mode signal rejection is achieved by means of a bidirectional current conducting circuit coupled between the input circuits of the two branches of the differential amplifier. The use of a conventional overall negative feedback circuit for each branch of the amplifier provides the desired feedback from the output to the input circuits, but is also provides an undesired feed forward from the input to the output circuits. This latter action practically nullifies the common mode rejection action.

It, therefore, is an object of this invention to provide a differential amplifier with overall negative feedback and good common mode signal rejection.

SUMMARY OF THE INVENTION

The differential amplifier embodying the invention comprises two signal input stages, each having two-terminal input and output circuits with one terminal being common to both circuits. The common terminals of the two input stages are coupled to one another by means of a bidirectional current conducting circuit so as to effect common mode signal rejection in the output circuits of the stages. Two unidirectional current conducting negative feedback means are coupled between the output and input circuits of the amplifier stages. In a presently preferred embodiment of the invention there also is included an output signal amplifier stage in each feedback path. The output stage amplifier of one branch is coupled to an output terminal for that branch and to the input circuit of the other branch, the latter by way of a current source for the input stage of that other branch.

Figure 1:
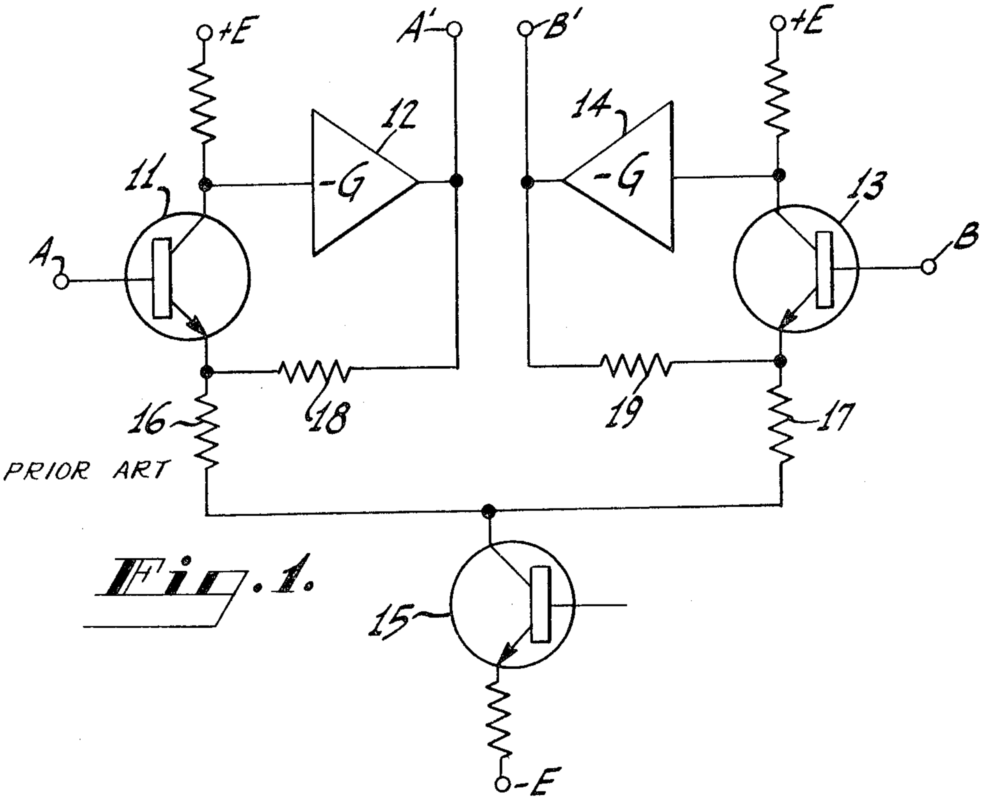
Figure 2:
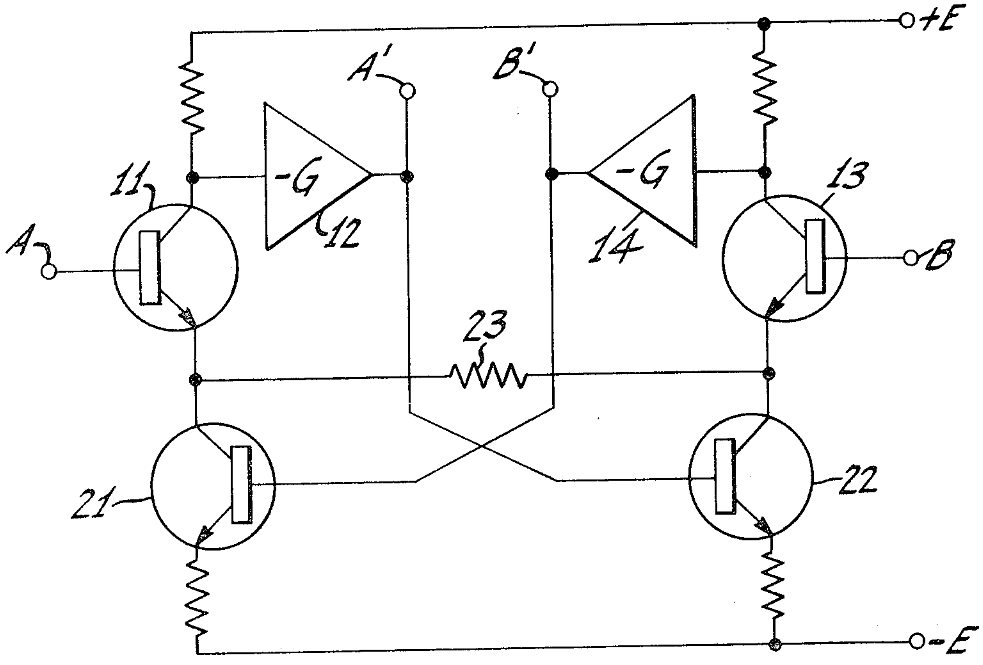
Figure 3:
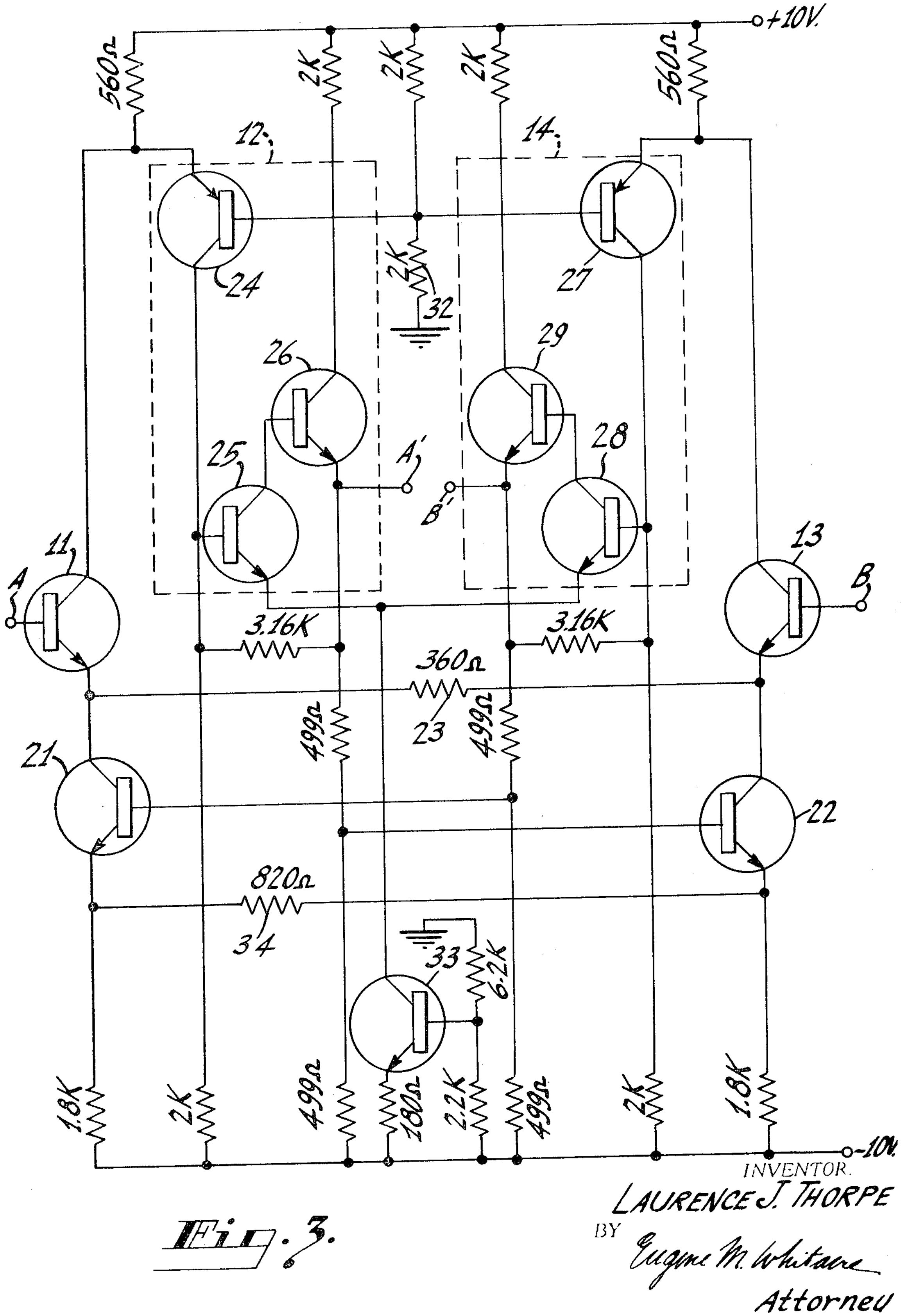

For a more specific disclosure of the invention reference may be had to the following detailed description of an illustrative embodiment thereof which is given in conjunction with the accompanying drawings, of which:

FIG. 1 is a circuit diagram of a differential amplifier illustrative of the way in which an overall negative feedback loop of the prior art type effectively nullifies a common mode signal rejection circuit connection;

FIG. 2 is a circuit diagram, partly in block form, illustrating the manner in which the present invention provides both overall negative feedback in a differential amplifier and good common mode signal rejection; and FIG. 3 is a detailed circuit diagram of a differential amplifier which embodies both of the features shown in FIG. 2 and which has been successfully employed in television signal processing apparatus.

DESCRIPTION OF THE INVENTION I

Before describing in detail the novel circuit arrangement of the invention, the deficiencies of a typical prior art differential amplifier with overall negative feedback will be considered with reference to FIG. 1. A first video signal at an input terminal A is impressed upon the base electrode of a first input stage amplifier transistor 11, the collector electrode of which is coupled to a first output stage amplifier 12 from which the amplified signal is developed at an output terminal A'. The other branch of the amplifier is similar, comprising a second input stage amplifier transistor 13 and a second output stage amplifier 14 tandemly coupled between an input terminal B and an output terminal B'. A source of current for the input stage transistors 11 and 13 includes a transistor 15 coupled in series with the emitter electrodes of these transistors by means including resistors 16 and 17.

Thus, the emitter electrodes of the transistors 11 and 13 which are common to both the input and output circuits of the first and second input stage amplifiers are effectively coupled to one another by the bidirectional current conducting means including the resistors 16 and 17. Such an arrangement, by itself, will produce good common mode rejection of signals impressed upon the input terminals A and B of the amplifier. This may be understood by considering the transistors 11 and 13 to be well matched, the resistors 16 and 17 to be substantially equal, and the circuit including the transistor 15 to be a substantially perfect current source. In this situation the same signal which is present simultaneously at the base electrodes of the input stage amplifiers 11 and 13 will produce substantially no output signal at the terminals A' and B'.

Consider now that overall negative feedback is added to the circuit arrangement of FIG. 1 described up to this point by coupling a resistor 18 between the output of the amplifier 12 and the emitter electrode of the input stage amplifier transistor 11 and by a similar connection of a resistor 19 in the other branch of the differential amplifier. Such connections result in the raising of the input impedances and the lowering of the output impedances of both branches of the differential amplifier and a desired reduction of the signal distortion. The common mode signal rejection provided by the circuit including the resistors 16 and 17, however, is virtually nullified by such a prior art negative feedback arrangement.

This may be understood by noting that the circuits including the resistors 18 and 19 conduct current bidirectionally. Thus, there not only is a desired signal transmission path from the output to the input of each branch of the amplifier to effect the overall negative feedback, but also there is an undesired signal transmission path directly from the input to the output of each amplifier branch, thereby practically nullifying the signal cancelling effect that would be obtained by the use of the differential amplifier configuration. Therefore, it is seen that any overall negative feedback should be achieved by some other arrangement than the one shown in FIG. 1 so that the common mode rejection capability of the circuit is not nullified.

A circuit arrangement providing negative feedback and common mode rejection is generally depicted in FIG. 2 in which components similar to those shown in FIG. 1 are identified by the same reference characters. The input stage amplifier transistors 11 and 13 have individual current sources respectively including transistors 21 and 22. The emitters of the input stage transistors 11 and 13 are coupled to one another by a bidirectional current conducting circuit including a resistor 23. The output of the output stage amplifier 12 is sampled and fed back to the input circuit of the input stage transistor 13 by way of its emitter and the current source transistor 22. This feedback circuit, it will be observed, effectively is a cross-connection from one branch of the differential amplifier to the other and is a unidirectional current conducting one in which there is no direct signal transmission path from the emitter of the transistor 13 to the output of the amplifier 12. A similar feedback circuit is provided from the output of the amplifier 14 to the input circuit of the transistor 11 by way of its emitter and the current source transistor 21.

The operation of the differential amplifier circuit arrangement of FIG. 2 may be understood by assuming that the base electrode of the input stage transistor 13 is grounded and that a positive-going signal is impressed upon the base electrode of the input stage transistor 11. A negative-going signal is produced at the collector electrode of the transistor 11 and is applied to the input circuit of the output stage transistor 12. This is a stage which, as will subsequently be disclosed, inverts the polarity of the signal and has a gain of magnitude G so as to produce in its output circuit a positive-going signal corresponding to the signal input to the input stage amplifier transistor 11. By means of the resistor 23 the emitter of the input stage transistor 13 also is driven by the assumed positive-going input signal so that a corresponding positive-going signal is produced at the collector electrode of the transistor 13. Thus, the impression of such a signal upon the inverter output amplifier stage 14 produces in the output of that stage a negative-going signal which not only is of opposite polarity to the signal produced in the output circuit of the output stage amplifier 12 but also is of equal magnitude to it. This negative-going signal produced in the output of the amplifier stage 14 is applied to the base electrode of the current source transistor 21 and appears as a positive-going signal at the collector electrode of the transistor 21 and, hence, at the emitter electrode of the input amplifier stage transistor 11 which is the proper phase and magnitude for series-applied negative feedback.

The similar feedback path from the output of the output amplifier stage 12 to the emitter electrode of the input amplifier stage transistor 13 operates in the same manner as that described. Both of these feedback paths are unidirectional current conducting ones.

The details of a differential amplifier of the general form shown in FIG. 2 and which has been successfully embodied in television signal processing apparatus are illustrated in FIG. 3 in which components similar to those shown in FIGS. 1 and 2 are identified by the same reference characters. The output amplifier stage 12 includes a driver stage transistor 24 which responds to output signals from the input stage amplifier transistor 11 and drives a feedback pair of transistors 25 and 26. The output stage amplifier 14 also includes a driver stage transistor 27 coupled between the input stage transistor 13 and a feedback pair of transistors 28 and 29. The base electrodes of the driver stage transistors 24 and 27 are commonly connected to a source of fixed potential produced by voltage divider resistors 31 and 32. These common base transistors serve two purposes. One purpose is to minimize the voltage ranges at the collector electrode of the input stage transistors 11 and 13, thereby enabling the base electrodes of these transistors to accommodate common mode signals of greater magnitudes. A second purpose is to shift the signal level toward ground potential so that the outputs of the output stage amplifiers 12 and 14 may be balanced about ground potential, thereby requiring no input-to-output signal offset.

As in the general form of the invention shown in FIG. 2, the differential amplifier of FIG. 3 produces signals at the output terminals A′ and B′ representative of the differences between the signals impressed upon the input terminals. The output signals at the terminals A′ and B′ are sampled and fed back to the input stage transistors 11 and 13 by way of the current source transistors 21 and 22, thereby completing the described overall negative feedback loops by which the signal distortion is minimized.

The two feedback pairs of transistors 25–26 and 28–29 have a current source including a transistor 33, the base electrode of which is maintained at a fixed potential. This current source is separate from those including the transistors 21 and 22 so that the D.C. biases and other parameters of the input stage amplifier transistors 11 and 13 may be independently adjusted to insure their desired operation in the manner described. Also, the emitter electrodes of the current source transistors 21 and 22 are interconnected by a resistor 34 for the purpose of enabling a control of the loop gain of the differential amplifier by suitably adjusting the value of the resistor 34.

In the circuit diagram of FIG. 3 the values of the components are given as they have been embodied in a successfully operated form of the invention. The NPN N transistors 11, 13, 21, 22, 25, 26, 28, 29 and 33 are type 2N2222 and the PNP transistors 24 and 27 are type 2N2907. It is to be understood that the component values and transistor types are intended to be illustrative and not limiting. Another successfully operated form of the invention has included transistors on one or more monolithic chips which enable somewhat better matching of certain ones such as the input stage transistors 11 and 13, for example.

The nature of the differential amplifier in accordance with this invention, together with its utility and unique aspects, has been described with reference to an illustrative embodiment thereof. The scope of the invention is set forth in the following claims.

What is claimed is:

1. A differential amplifier with overall negative feedback to provide a balanced differential signal output providing common mode rejection for signals applied respectively to two branches of an input stage, said amplifier comprising:

first and second input stage signal amplifiers, each having a two-terminal input circuit and a two-terminal output circuit, one terminal being common to both input and output circuits;

mans for impressing two signals upon the respective input circuits of said first and second input amplifiers;

bidirectional current conducting means coupling said common terminals of said first and second input amplifiers so as to effect common mode signal rejection in the respective output circuits of said input amplifiers; and first and second unidirectional current conducting negative feedback circuits respectively coupled between said output circuit of said first input amplifier and said common terminal of said input circuit of said second input amplifier and from said output circuit of said second input amplifier to said common terminal of said input circuit of said first input amplifier, said first and second unidirectional current conducting negative feedback circuits respectfully including first and second signal output terminals for providing said balanced differential signal output between said first and second signal output terminals of said respective first and second unidirectional current conducting negative feedback circuits.

2. A differential amplifier as defined in claim 1, wherein:

said first and second feedback circuits each include an output amplifier;

said output amplifier of said first unidirectional current conducting negative feedback circuit having an input circuit coupled to said output circuit of said first input amplifier, and an output circuit coupled to said first signal output terminal; and said output amplifier of said second unidirectional current conducting negative feedback circuit having an input circuit coupled to said output circuit of said second input amplifier, and an output circuit coupled to said second signal output terminal.

3. A differential amplifier as defined in claim 2, wherein:

said first and second unidirectional current conducting negative feedback circuits include respective first and second unidirectional current sources respectively connected to said common terminal of said respective second and first input amplifiers, each of said unidirectional current sources having a current-controlling terminal; and said first and second output circuits of said first and second output amplifiers being connected respectively to said current-controlling terminals of said respective first and second unidirectional current sources.

4. A differential amplifier as defined in claim 3, wherein:

each of said output amplifiers of said first and second unidirectional current conducting negative feedback circuits is a signal polarity inverter.

5. A differential amplifier as defined in claim 4, wherein:

each of said first and second input signal amplifiers comprises a transistor of which said two-terminal input circuit includes base and emitter electrodes and said two-terminal output circuit includes collector and emitter electrodes; and said bidirectional current conducting means comprises a resistive circuit coupling said emitter electrodes of said first and second input amplifiers.

6. A differential amplifier as defined in claim 5, wherein:

each of said output signal amplifiers of said first and second unidirectional current conducting negative feedback circuits respectively include first and second drivers stages, each having an input and an output terminal, and first and second feedback pairs of transistors, each feedback pair having an input and an output terminal;

means coupling said first and second driver stage input terminals respectively to said first and second input amplifier collector electrodes;

means coupling said respective first and second driver stage output terminals to said respective input terminals of said first and second feedback pairs of transistors; and means coupling said respective output terminals of said first and second feedback pairs of transistors to said current-controlling terminals of said respective first and second current sources.

7. A differential amplifier as defined in claim 6, wherein said first and second driver stages respectively comprise:

first and second transistors, each having base, emitter and collector electrodes, said first and second driver transistor emitter and collector electrodes respectively constituting said input and output terminals of said respective first and second driver stages, and said first and second driver transistor base electrodes being commonly connected to a source of fixed potential.

8. A differential amplifier as defined in claim 7, wherein:

said first and second current sources respectively include first and second transistors, each having base, emitter and collector electrodes;

said emitter and collector electrodes of said first and second unidirectional current source transistors being effectively in series circuits respectively with said emitter electrodes of said respective second and first input amplifier transistors; and said base electrodes of said first and second unidirectional current source transistors constituting said current-controlling terminals of said respective first and second unidirectional current sources.

* * * * *